(12) United States Patent
Honda

(10) Patent No.: US 8,614,448 B2
(45) Date of Patent: Dec. 24, 2013

(54) SEMICONDUCTOR DEVICE AND METHOD FOR MANUFACTURING A SEMICONDUCTOR DEVICE HAVING A MAXIMAL CARRIER CONCENTRATION AT MULTIPLE CARRIER CONCENTRATION PEAK POSITIONS

(75) Inventor: Shigeto Honda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 19 days.

(21) Appl. No.: 13/237,577

(22) Filed: Sep. 20, 2011

(65) Prior Publication Data

US 2012/0187416 A1    Jul. 26, 2012

(30) Foreign Application Priority Data

Jan. 24, 2011    (JP) ................................. 2011-012325

(51) Int. Cl.
*H01L 29/15*        (2006.01)

(52) U.S. Cl.
USPC ....... 257/77; 257/140; 257/342; 257/E29.197

(58) Field of Classification Search
USPC .............................. 257/77, 342, 140, E29.197
See application file for complete search history.

(56) References Cited

U.S. PATENT DOCUMENTS

| 4,111,720 | A | * | 9/1978 | Michel et al. ................. 438/334 |
| 5,200,632 | A | | 4/1993 | Sakurai |
| 5,264,378 | A | | 11/1993 | Sakurai |
| 5,270,230 | A | | 12/1993 | Sakurai |
| 2001/0040255 | A1 | * | 11/2001 | Tanaka ........................... 257/342 |
| 2003/0047778 | A1 | | 3/2003 | Nakamura et al. |
| 2005/0062105 | A1 | | 3/2005 | Nakamura et al. |
| 2005/0082607 | A1 | | 4/2005 | Nakamura et al. |
| 2005/0253169 | A1 | | 11/2005 | Suekawa |
| 2006/0163664 | A1 | | 7/2006 | Kaneda et al. |
| 2007/0103951 | A1 | * | 5/2007 | Ishikawa et al. .............. 363/146 |
| 2008/0064148 | A1 | | 3/2008 | Kaneda et al. |
| 2008/0093623 | A1 | | 4/2008 | Kono |
| 2009/0283862 | A1 | | 11/2009 | Suekawa |
| 2009/0283863 | A1 | | 11/2009 | Suekawa |

FOREIGN PATENT DOCUMENTS

| DE | 41 12 905 A1 | 10/1991 |
| DE | 10 2006 002 438 A1 | 8/2006 |
| EP | 2 242 107 A1 | 10/2010 |
| JP | 2002-299346 | 10/2002 |
| JP | 2002-299623 | 10/2002 |
| JP | 2004-311481 | 11/2004 |
| JP | 2005-354031 | 12/2005 |
| JP | 2008-211148 | 9/2008 |

(Continued)

OTHER PUBLICATIONS

Office Action issued in Application No. 10-2012-0005054 on Mar. 28, 2013.

(Continued)

*Primary Examiner* — Trung Q Dang
(74) *Attorney, Agent, or Firm* — Oblon, Spivak, McClelland, Maier & Neustadt, L.L.P.

(57) ABSTRACT

A semiconductor device includes a semiconductor substrate having a collector layer in which the carrier concentration is maximized at a carrier concentration peak position that is 1 μm or more from a surface of the semiconductor substrate. The semiconductor device further includes a collector electrode formed in contact with a surface of the collector layer.

5 Claims, 8 Drawing Sheets

(56) References Cited

FOREIGN PATENT DOCUMENTS

| JP | 2010-56134 | 3/2010 |
| JP | 2010-206111 | 9/2010 |
| JP | 2011-12325 | 1/2011 |
| KR | 10-0726899 | 5/2006 |
| WO | WO 02/061843 | 8/2002 |

OTHER PUBLICATIONS

Office Action issued in German application No. 10 2011 088 624.9 on Apr. 10, 2013.

* cited by examiner

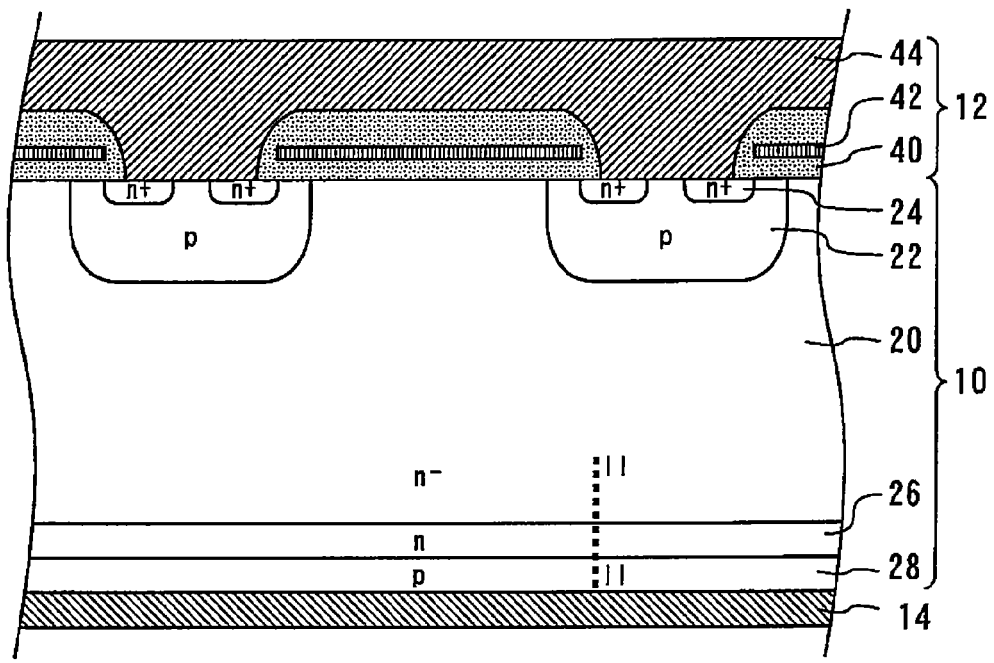
F I G. 1
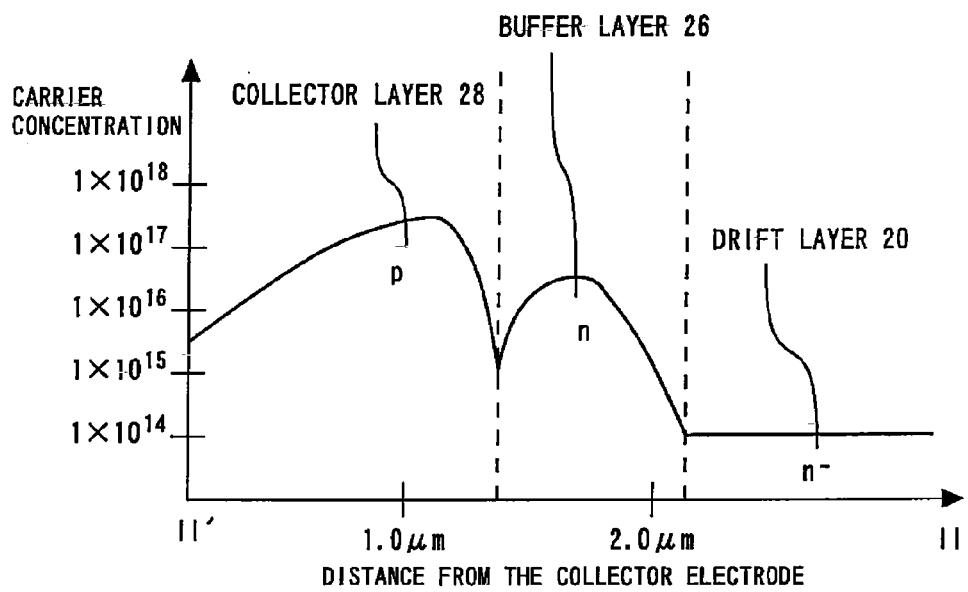
F I G. 2

SEMICONDUCTOR DEVICE AND METHOD FOR MANUFACTURING A SEMICONDUCTOR DEVICE HAVING A MAXIMAL CARRIER CONCENTRATION AT MULTIPLE CARRIER CONCENTRATION PEAK POSITIONS

BACKGROUND OF THE INVENTION

1. Field of the Invention

The present invention relates to a semiconductor device including a semiconductor substrate with a collector layer formed thereon, and to a method of manufacturing such a semiconductor device.

2. Background Art

Japanese Laid-Open Patent Publication No. 2004-311481 discloses a semiconductor device including a collector layer in contact with a collector electrode. The collector layer has a carrier concentration profile or distribution having a peak value at a position proximate to the collector electrode, and the collector layer and the collector electrode are in ohmic contact with each other. It should be noted that the term "carrier concentration peak position" is hereinafter used to refer to a position where a carrier concentration profile has a peak value.

In order to reduce the switching loss of a semiconductor device, it is known practice to reduce the level of the carrier concentration at the carrier concentration peak position in the collector layer. This means, however, that the carrier concentration at the carrier concentration peak position is more likely to be affected by contamination in the manufacturing atmosphere. It was found that the carrier concentration at the carrier concentration peak position was affected by contamination in the manufacturing atmosphere to such an extent that the manufactured semiconductor devices did not have the desired characteristics or varied in characteristics.

SUMMARY OF THE INVENTION

The present invention has been made to solve the above problems.

It is, therefore, an object of the present invention to provide a semiconductor device in which the level of the carrier concentration at the carrier concentration peak position in the collector layer is reduced while preventing the carrier concentration from being affected by contamination in the manufacturing atmosphere. Another object of the invention is to provide a method of manufacturing such a semiconductor device.

According to one aspect of the present invention, a semiconductor device includes a semiconductor substrate having a collector layer in which the carrier concentration is maximized at a carrier concentration peak position that is 1 μm or more from a surface of the semiconductor substrate, and a collector electrode formed in contact with a surface of the collector layer.

According to another aspect of the present invention, a method of manufacturing a semiconductor device, including the steps of forming a surface structure on a top surface of a semiconductor substrate, ion implanting a bottom surface of the semiconductor substrate with a dopant, forming a collector layer by activating the dopant by annealing, after the collector layer forming step, etching the portion of the collector layer that was exposed to ambient atmosphere during the annealing, and after the etching step, forming a collector electrode in contact with the collector layer.

Other and further objects, features and advantages of the invention will appear more fully from the following description.

BRIEF DESCRIPTION OF THE DRAWINGS

FIG. 1 is a cross-sectional view of a semiconductor device in accordance with a first embodiment of the present invention;

FIG. 2 is diagram showing the carrier concentration along dashed line II-II' of FIG. 1;

DETAILED DESCRIPTION OF THE PREFERRED EMBODIMENTS

First Embodiment

Figure 3:
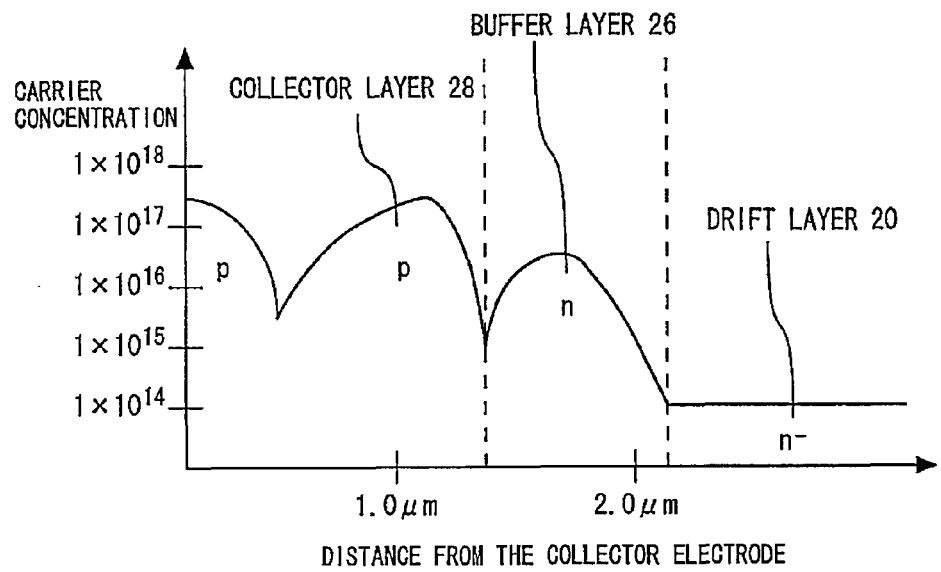
FIG. 3 is a diagram showing a variation of the carrier concentration profile of the semiconductor device of the first embodiment.

FIG. 1 is a cross-sectional view of a semiconductor device in accordance with a first embodiment of the present invention. The semiconductor device of the first embodiment is an IGBT (Insulated Gate Bipolar Transistor) having an LPT (Light Punch Through) structure. This semiconductor device includes a semiconductor substrate 10 formed of silicon. A surface structure 12 is formed on the top surface of the semiconductor substrate 10. A collector electrode 14 is formed on the bottom surface of the semiconductor substrate 10.

First, the semiconductor substrate 10 will be described. The semiconductor substrate 10 includes an n-drift layer 20. On the top side of the n-drift layer 20 are formed a p-type base layer 22 and an n-type emitter layer 24 covered with the p-type base layer 22. On the other hand, an n-type buffer layer 26 is formed on the bottom side of the n-drift layer 20. Further, a p-type collector layer 28 is formed in contact with the n-type buffer layer 26. The p-type collector layer 28 is disposed in the bottom surface of the semiconductor substrate 10 and in contact with the collector electrode 14. In other words, the collector electrode 14 is formed in contact with the bottom surface of the p-type collector layer 28. It should be noted that the dopant in the n-drift layer 20 and in the n-type buffer layer 26 is P and the dopant in the p-type collector layer 28 is B.

Next, the surface structure 12 will be described. The surface structure 12 includes an insulating film 40 and a gate electrode 42.

The insulating film 40 is formed to isolate the gate electrode 42 from the semiconductor substrate 10. An emitter electrode 44 is formed to cover the insulating film 40.

FIG. 2 is a diagram showing the carrier concentration along dashed line II-II' of FIG. 1. The carrier concentration throughout the n-drift layer 20 is uniform and equal to $1.0 \times 10^{14}$ [atoms/cm$^3$]. The carrier concentration profile in the n-type buffer layer 26 has a peak value at a position (or carrier concentration peak position) approximately midway through the thickness of the layer. The carrier concentration at the carrier concentration peak position in the n-type buffer layer 26 is approximately $5.0 \times 10^{16}$ [atoms/cm$^3$].

The p-type collector layer 28 has a thickness of approximately 1.4 μm. The carrier concentration profile in the p-type collector layer 28 has a maximum point (peak) at a position (or carrier concentration peak position) 1 μm or more from the collector electrode 14. That is, the carrier concentration peak position where the carrier concentration in the p-type collector layer 28 is maximized is 1 μm or more from the bottom surface of the layer. The carrier concentration at the carrier concentration peak position in the p-type collector layer 28 is approximately $2.0 \times 10^{17}$ [atoms/cm$^3$].

Thus, the level of the carrier concentration at the carrier concentration peak position in the p-type collector layer 28 is reduced. This means, however, that the carrier concentration at the carrier concentration peak position is more likely to be affected by contamination in the manufacturing atmosphere. For example, if a concentration of boron of $1.0 \times 10^{12}$ [atoms/cm$^2$] has diffused to a 7depth of approximately 0.1 μm from the surface of the semiconductor substrate due to contamination in the manufacturing atmosphere, the peak concentration of contaminating boron in the semiconductor substrate reaches $1.0 \times 10^{17}$ [atoms/cm$^3$]. It should be noted that this diffusion is promoted primarily by the annealing process. If this contamination extends to the carrier concentration peak position, it is not possible to adjust the carrier concentration at that position to the desired level.

However, the semiconductor device of the first embodiment is constructed so as to reduce the influence of contamination in the manufacturing atmosphere on the carrier concentration at the carrier concentration peak position. Specifically, the carrier concentration peak position in the p-type collector layer 28 is 1 μm or more from the collector electrode 14. Therefore, in the manufacture of the semiconductor device, even if the p-type collector layer 28 is exposed to contamination in the manufacturing atmosphere before the collector electrode 14 is formed thereon, this contamination is unlikely to affect the carrier concentration peak position in the p-type collector layer 28.

As a result, it is possible to reduce the level of the carrier concentration at the carrier concentration peak position in the p-type collector layer 28 and thereby reduce the switching loss of the semiconductor device while preventing the carrier concentration from being affected by contamination in the manufacturing atmosphere. Further, since the carrier concentration at the carrier concentration peak position in the p-type collector layer 28 can be accurately controlled, the Vce (sat)-Eoff trade-off curve can be adjusted over a wider range. These advantages serve to increase the manufacturing yield of the semiconductor device.

It should be noted that the reduction in the carrier concentration level at the carrier concentration peak position in the p-type collector layer 28 is particularly advantageous in terms of the operation speed of the semiconductor device. More specifically, the semiconductor device is capable of high speed operation if the carrier concentration at the carrier concentration peak position in the p-type collector layer 28 is $1.0 \times 10^{18}$ [atoms/cm$^3$] or less.

FIG. 3 is a diagram showing a variation of the carrier concentration profile of the semiconductor device of the first embodiment. This carrier concentration profile differs from that of the first embodiment in that the carrier concentration profile in the p-type collector layer has a second peak value at a position proximate to the collector electrode on the p-type collector layer. This position is referred to herein as the "second carrier concentration peak position," and the carrier concentration peak position described above in connection with the first embodiment and located 1 pm or more from the collector electrode 14 is referred to herein as the "first carrier concentration peak position." The carrier concentration at the second carrier concentration peak position is lower than that at the first carrier concentration peak position. In this variation, the portion of the p-type collector layer in contact with the collector electrode has a higher carrier concentration than in the first embodiment, since the second carrier concentration peak position (where the carrier concentration profile in the p-type collector layer has the second highest peak) is located immediately proximate to the collector electrode. This reduces the contact resistance between the p-type collector layer and the collector electrode. Further, since the first carrier concentration peak position (where the carrier concentration in the p-type collector layer is highest) is located 1 μm or more from the collector electrode, in the manufacture of the semiconductor device it is possible to reduce the influence of contamination in the manufacturing atmosphere on the carrier concentration at the first carrier concentration peak position.

Although in this variation the second carrier concentration peak position in the p-type collector layer is located proximate to the collector electrode, it is to be understood that the present invention is not limited to this particular arrangement. The contact resistance between the p-type collector layer and the collector electrode can be reduced when the second carrier concentration position in the p-type collector layer is located anywhere between the first carrier concentration peak position and the collector electrode.

In the semiconductor device of the first embodiment, the conductivity type of each layer may be reversed. Further, the first embodiment is not limited to any particular type or structure of semiconductor device, since the embodiment may be applied to any semiconductor device in which the collector electrode is formed in contact with the p-type collector layer, without sacrificing the advantages of the present invention.

Although in the first embodiment the semiconductor substrate 10 is formed of silicon, it is to be understood that it may be formed of a wide bandgap semiconductor having a wider bandgap than silicon. Examples of wide bandgap semiconductors include silicon carbide, gallium nitride-based materials, and diamond.

Second Embodiment

Figure 4:
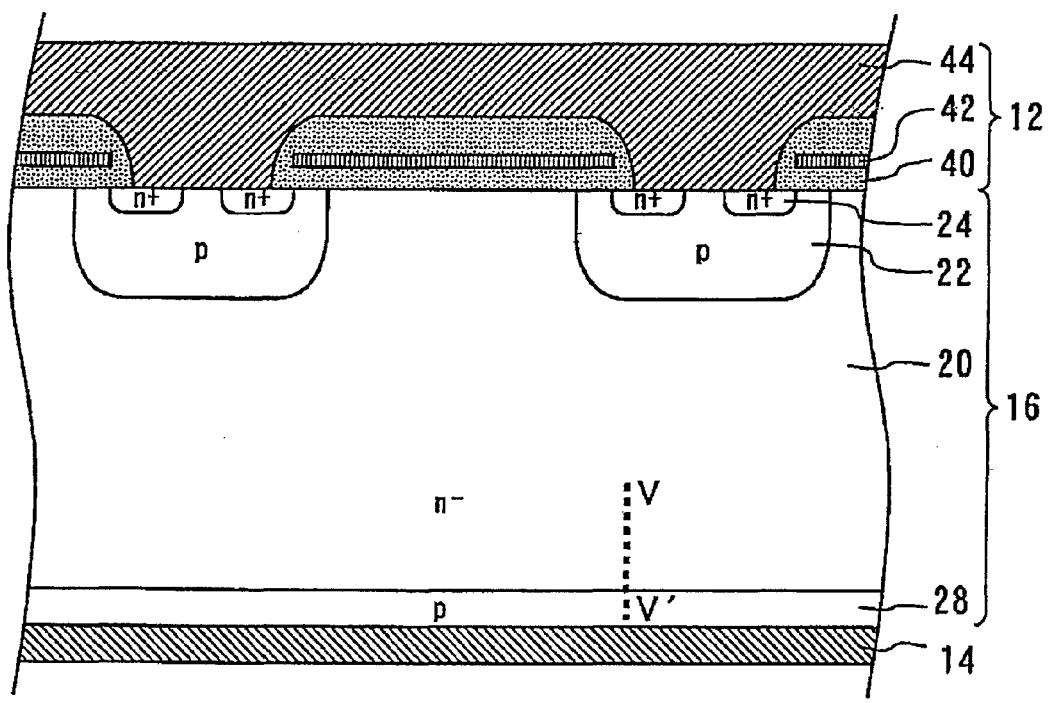
FIG. 4 is a cross-sectional view of a semiconductor device in accordance with a second embodiment of the present invention.
Figure 5:
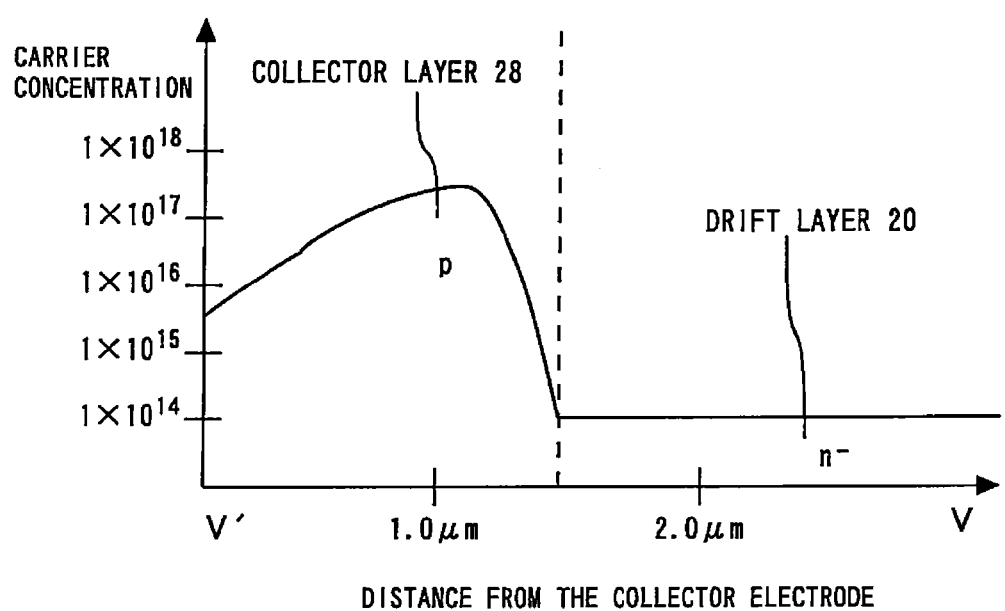
FIG. 5 is a diagram showing the carrier concentration along dashed line V-V' of FIG. 4.

FIG. 4 is a cross-sectional view of a semiconductor device in accordance with a second embodiment of the present invention. The semiconductor device of the second embodiment differs from that of the first embodiment in that the n-type buffer layer is omitted. FIG. 5 is a diagram showing the carrier concentration along dashed line V-V' of FIG. 4. Also in this semiconductor device (which is not provided with an n-type buffer layer), the carrier concentration peak position in the p-type collector layer 28 is 1 μm or more from the collector electrode 14 to achieve the above described advantages of the present invention.

Third Embodiment

Figure 6:
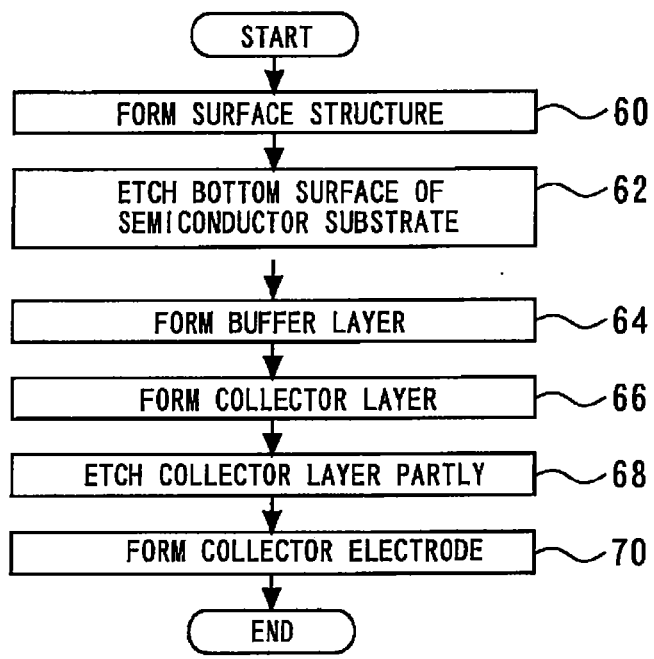
FIG. 6 is a flowchart showing a method of manufacturing a semiconductor device in accordance with a third embodiment of the present invention.
Figure 7:
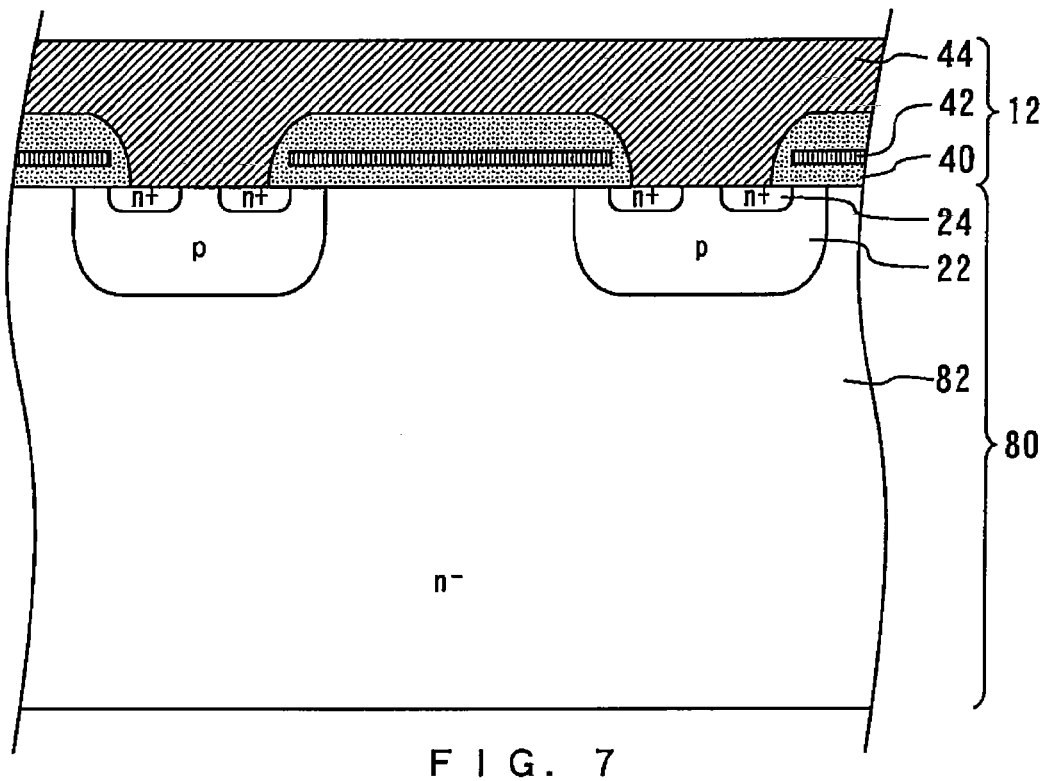
FIG. 7 is a cross-sectional view showing the surface structure formed on the surface of the semiconductor substrate.

FIG. 6 is a flowchart showing a method of manufacturing a semiconductor device in accordance with a third embodiment of the present invention. The method of manufacturing a semiconductor device in accordance with the third embodiment will be described with reference to FIG. 6. First, a surface structure 12 is formed on the surface of a semiconductor substrate 80 (step 60). FIG. 7 is a cross-sectional view showing the surface structure 12 formed on the surface of the semiconductor substrate 80 in step 60. The details of the surface structure 12 have already been described above.

Figure 8:
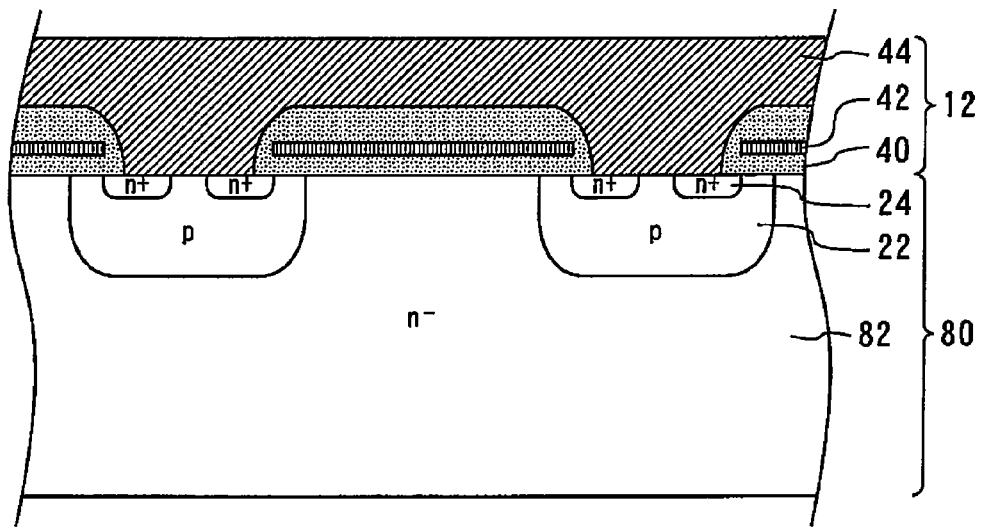
FIG. 8 is a cross-sectional view showing the semiconductor substrate after its bottom surface has been etched.

Next, the bottom surface of the semiconductor substrate 80 is etched (step 62). FIG. 8 is a cross-sectional view showing the semiconductor substrate 80 after its bottom surface has been etched.

This etching reduces the thickness of the n-drift layer 82 to the desired thickness. It should be noted that the n-drift layer 82 may be thinned by grinding, instead of etching.

Figure 9:
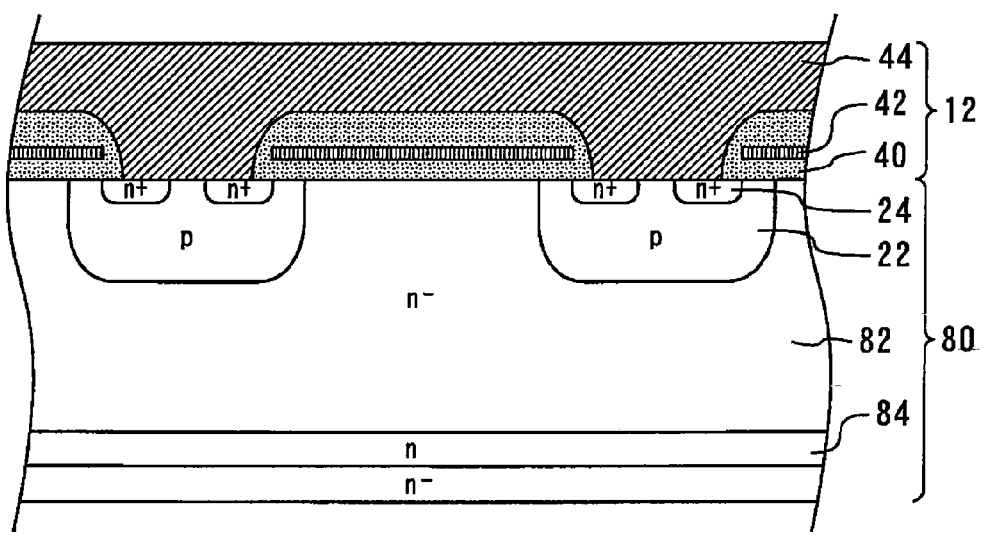
FIG. 9 is a cross-sectional view showing the n-type buffer layer formed on the bottom surface of the semiconductor substrate.

An n-type buffer layer 84 is then formed on the bottom surface of the semiconductor substrate 80 (step 64). FIG. 9 is a cross-sectional view showing the n-type buffer layer 84 formed on the bottom surface of the semiconductor substrate 80. The n-type buffer layer 84 is formed by first ion-implanting the bottom surface of the substrate with an n-type dopant such as P and then activating the dopant by laser annealing.

Figures 10, 11:
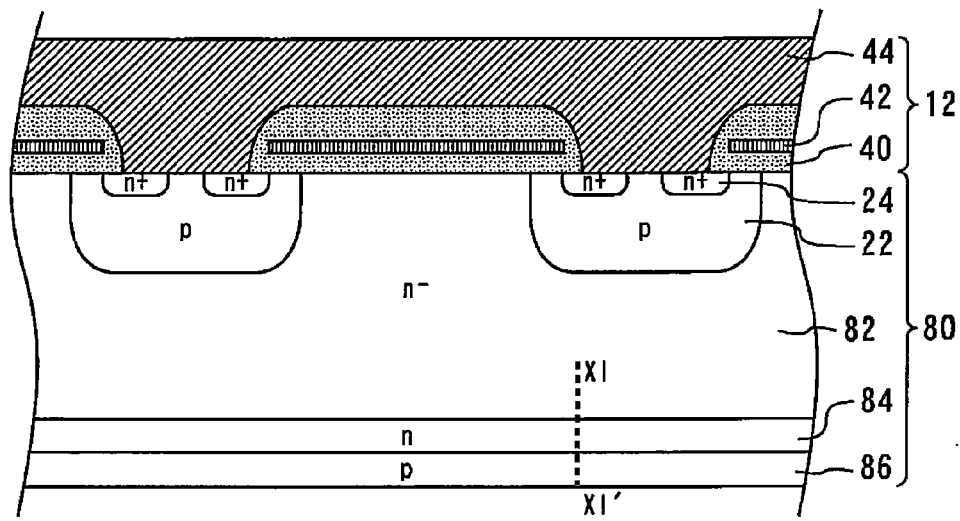
FIG. 10 is a cross-sectional view showing the p-type collector layer formed on the bottom surface of the semiconductor substrate.
FIG. 11 is a diagram showing the carrier concentration along dashed line XI-XI' of FIG. 10.

A p-type collector layer 86 is then formed (step 66). FIG. 10 is a cross-sectional view showing the p-type collector layer 86 formed on the bottom surface of the semiconductor substrate. The p-type collector layer 86 is formed by first ion-implanting the bottom surface of the semiconductor substrate 80 with a p-type dopant such as B and then activating the dopant by laser annealing. FIG. 11 is a diagram showing the carrier concentration along dashed line XI-XI' of FIG. 10. The carrier concentration peak position in the p-type collector layer 86 is 1.0 μm or more from the outside of the layer (i.e., from position XI' in FIG. 10). It should be noted that the carrier concentration distribution of FIG. 11 is the same as that shown in FIG. 2.

Figure 12:
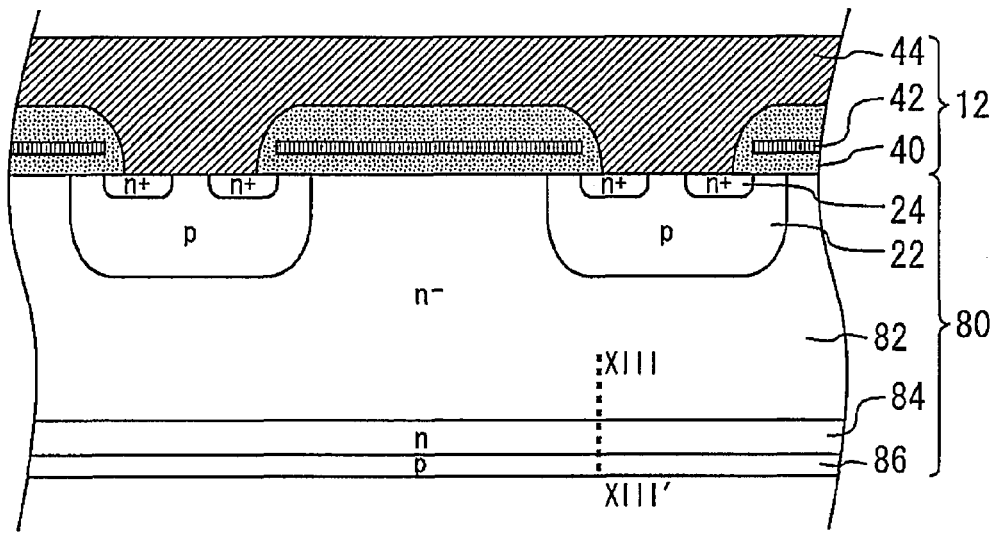
FIG. 12 is a cross-sectional view showing the p-type collector layer after the portion of the layer has been etched away.
Figure 13:
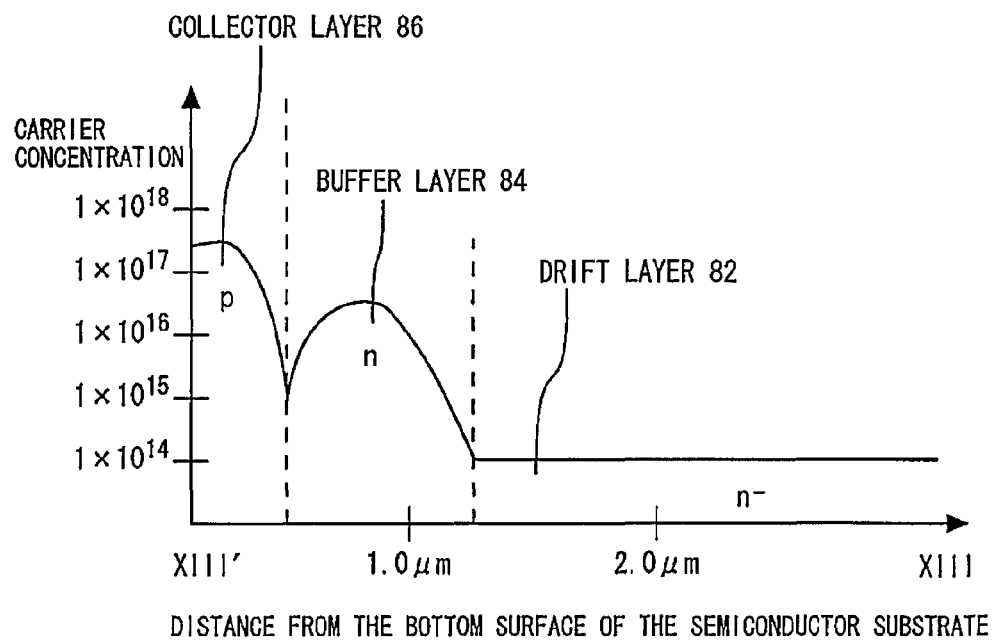
FIG. 13 is a diagram showing the carrier concentration along dashed line XIII-XIII' of FIG. 12.

A portion of the p-type collector layer 86 is then etched (step 68). FIG. 12 is a cross-sectional view showing the p-type collector layer 86 after the portion of the layer has been etched away. FIG. 13 is a diagram showing the carrier concentration along dashed line of FIG. 12. In step 68, the portion of the p-type collector layer 86 is etched away to expose the carrier concentration peak position in the p-type collector layer 86 to ambient atmosphere.

Figure 14:
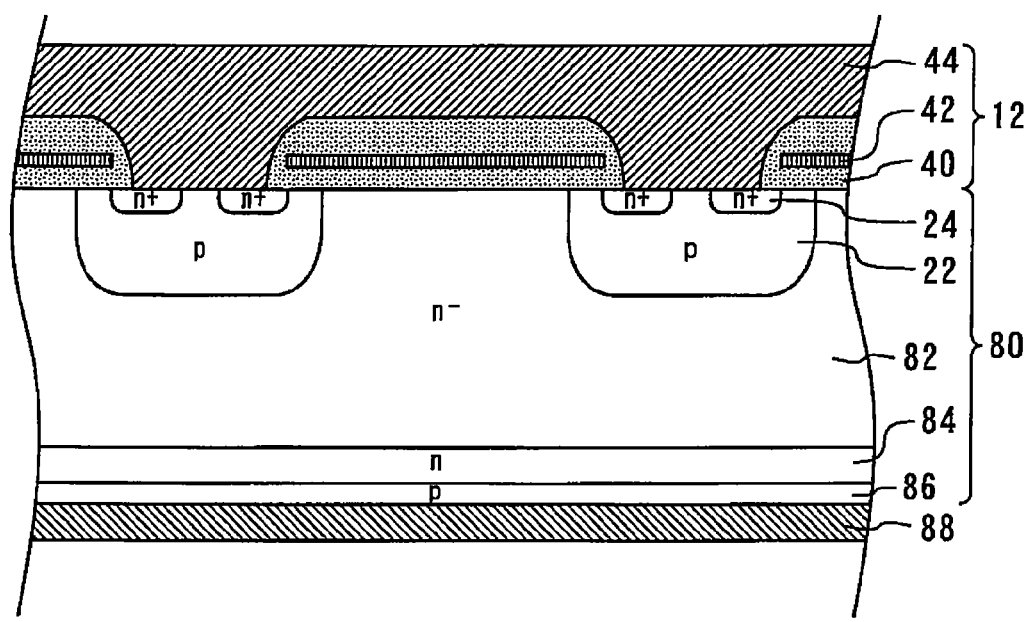
FIG. 14 is a cross-sectional view showing the formed collector electrode.

A collector electrode 88 is then formed (step 70). FIG. 14 is a cross-sectional view showing the formed collector electrode 88. The collector electrode 88 is formed in contact with the p-type collector layer 86 by sputtering, etc. The method of manufacturing a semiconductor device in accordance with the third embodiment includes the above steps.

In accordance with the semiconductor device manufacturing method of the third embodiment, when the p-type collector layer 86 is formed by annealing (in step 66), the carrier concentration peak position in the p-type collector layer 86 is 1 μm or more from the bottom surface of the semiconductor substrate 80 (i.e., the bottom surface of the p-type collector layer 86). This prevents the carrier concentration at the carrier concentration peak position in the p-type collector layer 86 from being affected by contamination in the manufacturing atmosphere. Further, when a portion of the p-type collector layer 86 is etched away (in step 68), the etching is stopped when the carrier concentration peak position in the p-type collector layer 86 has been exposed to ambient atmosphere. As a result, in step 70, the collector electrode can be formed immediately proximate to the carrier concentration peak position in the p-type collector layer 86 to reduce the contact resistance between the p-type collector layer 86 and the collector electrode. Further, since the portion of the p-type collector layer 86 that is etched away in step 68 is relatively low in carrier concentration, the removal of this portion results in reduced operating resistance of the semiconductor device.

The semiconductor device manufacturing method of the third embodiment is characterized in that step 66 in which the collector layer is formed by ion implantation and annealing is followed by step 68 in which the portion of the collector layer which was exposed to ambient atmosphere during the annealing process is etched away. This feature makes it possible to reduce the level of the carrier concentration at the carrier concentration peak position in the collector layer and thereby reduce the switching loss of the semiconductor device while preventing the carrier concentration at the carrier concentration peak position from being affected by contamination in the manufacturing atmosphere. It is also possible to reduce the resistance of the semiconductor device. The above annealing may be accomplished by heating the stage, instead of by laser annealing. Further, the third embodiment is susceptible of at least alterations which are the same as or correspond to those that can be made to the first embodiment.

In accordance with the present invention there is provided a semiconductor device in which the carrier concentration peak position in the collector layer is a relatively large distance from the outside of the collector layer so that the level of the carrier concentration at the carrier concentration peak position can be reduced while preventing the carrier concentration from being affected by contamination in the manufacturing atmosphere.

Obviously many modifications and variations of the present invention are possible in the light of the above teachings. It is therefore to be understood that within the scope of the appended claims the invention may be practiced otherwise than as specifically described.

The entire disclosure of a Japanese patent application No. 2011-012325, filed on Jan. 24, 2011 including specification, claims, drawings and summary, on which the Convention priority of the present application is based, are incorporated herein by reference in its entirety.

What is claimed is:

1. A semiconductor device comprising:
    a semiconductor substrate having a collector layer in which the carrier concentration is maximized at a carrier concentration peak position that is 1 μm or more from a surface of said semiconductor substrate; and
    a collector electrode formed in contact with a surface of said collector layer, wherein
    the carrier concentration at said carrier concentration peak position is $1 \times 10^{18}$ atoms/cm$^3$ or less,
    wherein said collector layer includes a second carrier concentration peak position between said carrier concentration peak position and said collector electrode, and
    the carrier concentration at said second carrier concentration peak position is lower than that at said carrier concentration peak position.

2. The semiconductor device according to claim 1, wherein said second carrier concentration peak position in said collector layer is located immediately proximate to said collector electrode.

3. The semiconductor device according to claim 1, wherein said semiconductor substrate is formed of a wide bandgap semiconductor.

4. The semiconductor device according to claim 3, wherein said wide bandgap semiconductor is silicon carbide, gallium nitride-based material, or diamond.

5. The semiconductor device according to claim 1, wherein the collector layer has a thickness of 1.4 μm.

* * * * *